(12) United States Patent
Bao et al.

(10) Patent No.: US 9,536,842 B2
(45) Date of Patent: Jan. 3, 2017

(54) STRUCTURE WITH AIR GAP CRACK STOP

(71) Applicant: GLOBALFOUNDRIES INC., Grand Cayman (KY)

(72) Inventors: Junjing Bao, San Diego, CA (US); Griselda Bonilla, Fishkill, NY (US); Samuel S. Choi, Hopewell Junction, NY (US); Ronald G. Filippi, Wappingers Falls, NY (US); Xiao H. Liu, Briarcliff Manor, NY (US); Naftali E. Lustig, Croton on Hudson, NY (US); Andrew H. Simon, Fishkill, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 56 days.

(21) Appl. No.: 14/574,430

(22) Filed: Dec. 18, 2014

(65) Prior Publication Data

US 2016/0181208 A1    Jun. 23, 2016

(51) Int. Cl.
*H01L 23/00* (2006.01)
*H01L 23/48* (2006.01)
*H01L 21/768* (2006.01)

(52) U.S. Cl.
CPC ......... *H01L 23/562* (2013.01); *H01L 21/7682* (2013.01); *H01L 21/76898* (2013.01); *H01L 23/481* (2013.01); *H01L 2924/0002* (2013.01)

(58) Field of Classification Search
CPC .. H01L 23/562; H01L 21/7682; H01L 23/481; H01L 21/76802; H01L 21/76877; H01L 21/76898; H01L 23/5222; H01L 23/53295; H01L 21/76807; H01L 21/76813; H01L 21/76885; H01L 21/76808; H01L 21/31144; H01L 23/5329; H01L 21/76831; H01L 21/76805; H01L 2221/1031; H01L 23/5226; H01L 21/76843; G03F 7/00; G03F 7/2022

(Continued)

(56) References Cited

U.S. PATENT DOCUMENTS 5,665,655 A    9/1997 White
7,109,093 B2   9/2006 Fitzsimmons et al.
(Continued)

OTHER PUBLICATIONS

Chen et al., "Ultralow-Capacitance Through-Silicon Vias With Annular Air-Gap Insulation Layers", IEEE Transactions on Electron Devices, vol. 60, No. 4, Apr. 2013, pp. 1421-1426.
(Continued)

*Primary Examiner* — Caleen Sullivan
(74) *Attorney, Agent, or Firm* — Yuanmin Cai; Hoffman Warnick LLC

(57) ABSTRACT

An method including forming multiple interconnect levels on top of one another, each level comprising a metal interconnect and a crack stop both embedded in a dielectric layer, and a dielectric capping layer directly on top of the dielectric layer and directly on top of the metal interconnect, the crack stop is an air gap which intersects an interface between the dielectric layer and the dielectric capping layer of each interconnect level, and forming a through substrate via through the multiple interconnect levels adjacent to, but not in direct contact with, the crack stop, the crack stop of each interconnect level is directly between the metal interconnect of each interconnect level and the through substrate via to prevent cracks caused during fabrication from propagating away from the through substrate via and damaging the metal interconnect.

18 Claims, 13 Drawing Sheets

(58) Field of Classification Search
USPC .......................... 257/758; 438/619, 624, 783
See application file for complete search history.

(56) References Cited

U.S. PATENT DOCUMENTS

| | | |
|---|---|---|
| 7,544,602 B2 | 6/2009 | Clevenger et al. |
| 7,790,577 B2 | 9/2010 | Liu et al. |
| 7,790,601 B1* | 9/2010 | Choi ................ H01L 21/31144 257/E21.587 |
| 7,955,952 B2 | 6/2011 | Liu et al. |
| 8,237,246 B2 | 8/2012 | Angyal et al. |
| 8,592,941 B2 | 11/2013 | Gambino et al. |
| 8,742,594 B2 | 6/2014 | Daubenspeck et al. |
| 2006/0038297 A1 | 2/2006 | Usami et al. |
| 2011/0193197 A1 | 8/2011 | Farooq et al. |
| 2012/0133046 A1 | 5/2012 | Chien et al. |
| 2013/0075913 A1* | 3/2013 | Cooney, III ...... H01L 21/76802 257/758 |

OTHER PUBLICATIONS

Chen et al., "Development of Ultra-Low Capacitance Through-Silicon-Vias (TSVs) with Air-Gap Liner", 2013 Electronic Components & Technology Conference, IEEE, pp. 1433-1438.

Civale et al., "Via-Middle Through-Silicon Via with Integrated Airgap to Zero TSV-induced Stress Impact on Device Performance", 2013 Electronic Components & Technology Conference, IEEE, pp. 1420-1424.

U.S. Appl. No. 14/024,663, entitled: "3D Chip Crackstop", filed Sep. 12, 2013.

U.S. Appl. No. 14/273,658, entitled: "Through Crack Stop Via", filed May 9, 2014.

Liao et al., "An Integrated Air Gap Structure to Achieve High-Performance TSV Interconnects for 28nm 3D-IC Integration", 2013 Symposium on VLSI Technology Digest of Technical Papers, pp. T42-T43.

Sunohara et al., "Development of Silicon Module with TSVs and Global Wiring (L/S= 0.8/0.8μm)", 2009 Electronic Components and Technology Conference, IEEE, pp. 25-31.

* cited by examiner

SECTION A-A

SECTION A-A

STRUCTURE WITH AIR GAP CRACK STOP

BACKGROUND

The present invention relates generally to semiconductor device manufacturing, and, more particularly, to the fabrication a vertically discontinuous air gap crack stop.

To minimize the BEOL interconnect portion of circuit delay, a conventional $SiO_2$ dielectric (k~4.0) has been replaced with dense lower-k films (K<3.0). However, for even further performance improvement, more parasitic capacitance reduction is required (k<2.5) for high-speed circuits. Most of the porous low-k dielectric materials, though, have relatively weak mechanical properties as compared to dense dielectrics. As such, it has become a significant challenge for current BEOL processes to integrate these materials with other module processes. For example, the conventional chemical-mechanical polish process has difficulty polishing porous dielectrics, and the conventional PVD diffusion barrier deposition technology cannot offer reasonable coverage on the surface of porous dielectrics.

Moreover, it has been found that when the dielectric constant of an insulator in an interconnect structure is reduced, mechanical properties are often compromised, giving rise to significant challenges in interconnect integration and reliability. By way of illustration, due to low adhesion of the dielectric an interfacial crack may occur during fabrication. This is a particular problem in the fabrication of multilevel interconnected integrated circuits since it can significantly reduce yield and impair reliability of the device.

In one example, to increase throughput, a plurality of integrated circuits are fabricated on a wafer, in parallel, using porous low-k dielectrics. The integrated circuits are then separated into individual chips using a process known as "dicing." However, as the kerf is diced, cracks and delaminations can be occur which can propagate into the active chip regions. This has been found to be especially problematic in multilevel devices where the dielectric constant of the insulator in an interconnect of the integrated circuit is reduced, mainly due to the mechanical properties of the insulator. Cracks in excess of a few microns in depth and several tenths of millimeters in length have been observed. The cracks and delaminations can either result in chip yield loss or reliability issues as the chip is stressed in a package.

To combat this problem, an air gap between the diced channel and the active chip region is fabricated using conventional RIE (reactive ion etching) processes. By way of illustration, after the multilevel interconnected chip is fabricated, a single RIE process is used to etch through all of the layers, preferably to the first capping layer above the first dielectric. By using the crack stop (e.g., air gap), it has been found that the cracks and delaminations will terminate at the crack stop, prior to reaching the active chip area. That is, the crack stop will eliminate or significantly reduce the crack/delamination driving force such that the propagation of the crack/delamination will be stopped prior to reaching the chip active area.

SUMMARY

According to one exemplary embodiment of the present invention, a method is provided. The method may include forming multiple interconnect levels on top of one another, each level comprising a metal interconnect and a crack stop both embedded in a dielectric layer, and a dielectric capping layer directly on top of the dielectric layer and directly on top of the metal interconnect, the crack stop is an air gap which intersects an interface between the dielectric layer and the dielectric capping layer of each interconnect level, and forming a through substrate via through the multiple interconnect levels adjacent to, but not in direct contact with, the crack stop, the crack stop of each interconnect level is directly between the metal interconnect of each interconnect level and the through substrate via to prevent cracks caused during fabrication from propagating away from the through substrate via and damaging the metal interconnect.

According to another exemplary embodiment of the present invention, a method is provided. The method may include forming a first interconnect level comprising a first metal interconnect embedded in a first dielectric layer, and a first dielectric capping layer directly on top of the first dielectric layer and directly on top of the first metal interconnect, etching a first opening through the first dielectric capping layer and into the first dielectric layer, the first opening extending from an upper surface of the first dielectric capping layer down to a depth into the first dielectric layer, forming a first crack stop in the first interconnect level by depositing a second dielectric layer above and in direct contact with the first interconnect level such that the first opening is pinched-off trapping a pocket of air, the first crack stop being constructed from the pocket of air trapped in the first opening, and forming a through substrate via through the first interconnect level adjacent to, but not in direct contact with, the first crack stop, the first crack stop is directly between the first metal interconnect and the through substrate via to prevent cracks caused during fabrication from propagating away from the through substrate via and damaging the first metal interconnect.

According to another exemplary embodiment of the present invention, a structure is provided. The structure may include a first interconnect level comprising a first metal interconnect embedded in a first dielectric layer and a first dielectric capping layer directly on top of the first dielectric layer and directly on top of the first metal interconnect, a first crack stop partially embedded in the first interconnect level, the first crack stop is an air gap which intersects an interface between the first dielectric layer and the first dielectric capping layer and partially extends into the first dielectric layer, a height or depth of the first crack stop is less than a height or thickness of the first interconnect level, and a through substrate via extending through the first interconnect level adjacent to, but not in physical contact with, the first crack stop, the first crack stop is positioned directly between the first metal interconnect and the through substrate via to prevent cracks caused during fabrication from propagating away from the through substrate via and damaging the first metal interconnect.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 1 illustrates forming an $M_x$ level according to an exemplary embodiment.

FIG. 2 illustrates forming a first opening in the $M_x$ level according to an exemplary embodiment.

FIG. 3 illustrates forming an $M_{x+1}$ level according to an exemplary embodiment.

FIG. 4 illustrates forming a second opening in the $M_{x+1}$ level according to an exemplary embodiment.

FIG. 5 illustrates forming an $M_{x+2}$ level and forming a third opening in the $M_{x+2}$ level according to an exemplary embodiment.

FIG. 6 illustrates forming a through substrate 150 and a final structure according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
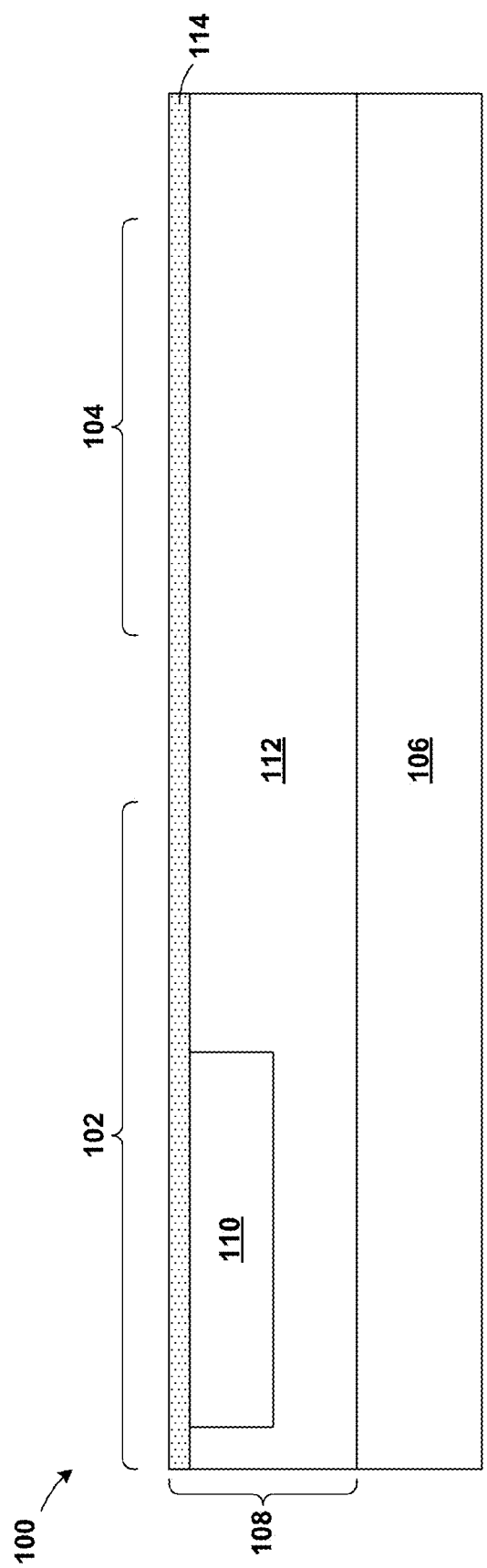
FIGS. 1-6 illustrate the steps of a method of forming a vertically discontinuous air gap crack stop, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor device manufacturing, and, more particularly, to the fabrication of a vertically discontinuous air gap crack stop. One way to manufacture the vertically discontinuous air gap crack stop may include forming partial depth air gaps stacked above one another in multiple successive metallization layers. One embodiment by which to fabricate the vertically discontinuous air gap crack stop is described in detail below by referring to the accompanying drawings FIGS. 1-6.

Referring to FIGS. 1-6, cross section views of a structure 100 are shown. The structure 100 may represent a portion of a semiconductor chip. Referring now to FIG. 1, the structure 100 may include a first region 102 and a second region 104. As will be described, typical interconnect wiring including multiple wiring levels including may be formed in the first region 102, and a through substrate via may be formed in the second region 104. The structure 100 may further include a semiconductor substrate 106 (hereinafter "substrate"), and an $M_x$ level 108. The substrate 106 employed in the present invention may include any semiconductor material including, but not limited to: undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. The substrate 106 may also include an organic semiconductor or a layered semiconductor such as Si/SiGe, a silicon-on-insulator (SOI) or a SiGe-on-insulator (SGOI). In the present embodiment, the substrate 106 has undergone front end of the line (FEOL) processing to fabricate various individual devices such as transistors, capacitors and the like. Such individual devices are not shown for clarity.

The $M_x$ level 108 may include an $M_x$ metal line 110 formed and embedded in an $M_x$ dielectric 112. The $M_x$ level 108 may further include an $M_x$ cap dielectric 114 directly above both the $M_x$ metal line 110 and the $M_x$ dielectric 112. The $M_x$ level 108 may be any interconnect level in the structure 100. The $M_x$ dielectric 112 may include any suitable dielectric material, for example, silicon oxide ($SiO_2$), silicon nitride ($Si_3N_4$), hydrogenated silicon carbon oxide (SiCOH), silicon carbon nitride (SiCN), silicon based low k dielectrics, or porous dielectrics. Known suitable deposition techniques, such as, for example, chemical vapor deposition, plasma enhanced chemical vapor deposition, atomic layer deposition, or physical vapor deposition may be used to form the $M_x$ dielectric 112. The $M_x$ dielectric 112 may have a typical thickness ranging from about 100 nm to about 450 nm and ranges there between, although a thickness less than 100 nm and greater than 450 nm may be acceptable. In an embodiment, the $M_x$ dielectric 112 may include hydrogenated silicon carbon oxide (SiCOH) deposited using a chemical vapor deposition technique with a conformal thickness ranging from about 120 nm to about 130 nm. It should be noted that while only a single interconnect level is shown, the structure 100 may have multiple interconnect levels either above and/or below the $M_x$ level 108. A chemical mechanical polishing technique may be applied to ensure a clean and flat surface in preparation for forming the $M_x$ metal line 110 and subsequent processing.

The $M_x$ metal line 110 may be formed in the $M_x$ dielectric 112 in accordance with typical lithography techniques. The $M_x$ metal line 110 may consist of a typical line or wire found in a typical semiconductor circuit. The $M_x$ metal line 110 may be fabricated using, for example, a typical damascene techniques in which a conductive interconnect material may be deposited in a trench formed in the $M_x$ dielectric 112.

In one embodiment, the $M_x$ metal line 110 may include various barrier liners (not shown). One barrier liner may include, for example, tantalum nitride (TaN), followed by an additional layer including tantalum (Ta). Other barrier liners may include cobalt (Co), or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material. A chemical mechanical polishing technique may be applied to ensure complete removal of excess conductive interconnect material prior to depositing the $M_x$ cap dielectric 114.

With continued reference to FIG. 1, the $M_x$ cap dielectric 114 may be deposited over the structure 100. The $M_x$ cap dielectric 114 may electrically insulate the $M_x$ level 108 from additional interconnect levels (not shown) that may be subsequently formed above the $M_x$ level 108, for example an $M_{x+1}$ level. The $M_x$ cap dielectric 114 may be used to improve interconnect reliability and prevent copper from diffusing into an $M_{x+1}$ dielectric that may be subsequently formed above. The $M_x$ cap dielectric 114 may be deposited using typical deposition techniques, for example, chemical vapor deposition. The $M_x$ cap dielectric 114 may include any suitable dielectric material, for example, silicon nitride ($Si_3N_4$), silicon carbide (SiC), silicon carbon nitride (SiCN), hydrogenated silicon carbide (SiCH), or other known capping materials. The $M_x$ cap dielectric 114 may have a thickness ranging from about 7 nm to about 30 nm and ranges there between, although a thickness less than 7 nm and greater than 30 nm may be acceptable.

Figure 2:
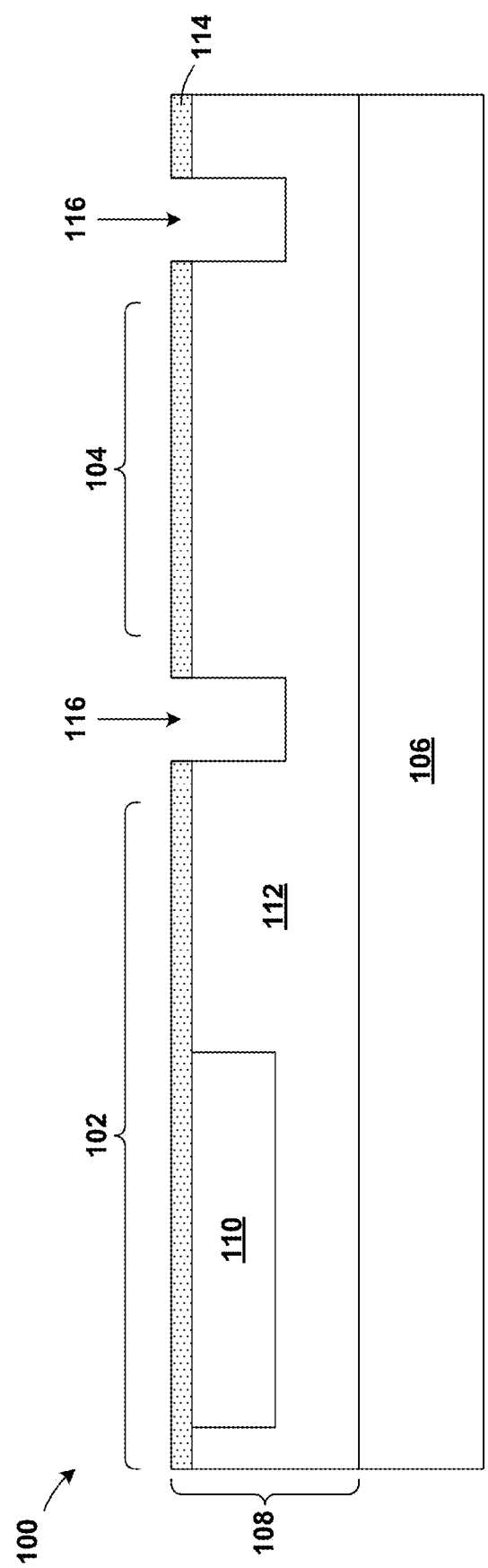

Referring now to FIG. 2, a first opening 116 may be formed through the $M_x$ cap dielectric 114 and partially embedded into the $M_x$ dielectric 112 of the $M_x$ level 108 using lithographic and etching techniques. In an embodiment, the $M_x$ cap dielectric 114 into the $M_x$ dielectric 112 may be etched using a reactive ion etch technique to create the first opening 116. In the present embodiment, the first opening 116 may be purposefully positioned between the first region 102 and the second region 104. The first opening 116 may extend from an upper surface of the $M_x$ cap dielectric 114 down to a depth into the $M_x$ dielectric 112. The first opening 116 may preferably extend a depth into the $M_x$ dielectric 112 without exposing an underlying level or, as illustrated, the substrate 106.

In an embodiment, a low or no damage plasma may be used to etch the first opening 116 with an aspect ratio of approximately 2:1. In such cases, the first opening 116 may have a height approximately double its width. Furthermore, the first opening 116 may have a width approximately greater than or equal to 10 nm, as described in more detail below with reference to FIG. 11. The first opening 116 may preferably intersect an interface between the $M_x$ dielectric 112 and the $M_x$ cap dielectric 114 where interfacial cracks and delamination may occur during fabrication. Locating the first opening 116 across the interface between the $M_x$ dielectric 112 and the $M_x$ cap dielectric 114 is essential to control the propagation of interfacial cracks along that interface.

Figure 3:
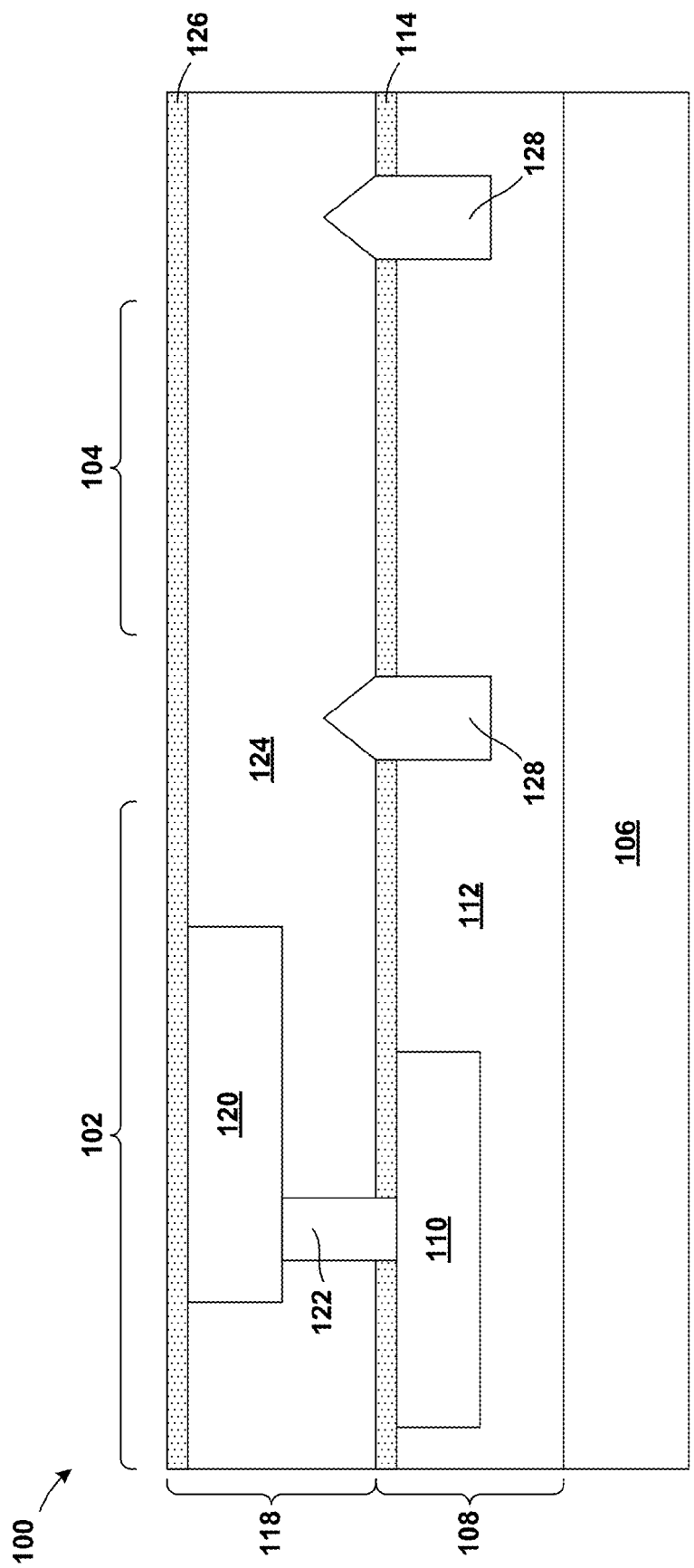

Referring now to FIG. 3, an $M_{x+1}$ level 118 may be formed above the $M_x$ level 108. The $M_{x+1}$ level 118 may include an $M_{x+1}$ metal line 120 and an $M_{x+1}$ via 122 both formed in an $M_{x+1}$ dielectric 124. The $M_{x+1}$ level 118 may further include an $M_{x+1}$ cap dielectric 126 directly above both the $M_{x+1}$ metal line 120 and the $M_{x+1}$ dielectric 124. The $M_{x+1}$ level 118 is substantially similar to the $M_x$ level 108 described above. Moreover, similar techniques as described above may be used to deposit the $M_{x+1}$ dielectric 124 on top of the first $M_x$ cap dielectric 114. Like above, a chemical mechanical polishing technique may be applied to ensure a clean and flat surface in preparation for forming the $M_{x+1}$ metal line 120 and the $M_{x+1}$ via 122 and subsequent processing.

After deposition of the $M_{x+1}$ dielectric 124, the first opening 116 may be pinched-off or capped to form a line level air gap or first crack stop 128. In other words, the first crack stop 128 may be constructed from a pocket of air trapped in the first opening 116 after deposition of the $M_{x+1}$ dielectric 124. As illustrated in figures, the $M_{x+1}$ dielectric 124 pinches-off or blocks the first opening 116, thereby producing the first crack stop 128. By closing off the first opening 116, it is possible to maintain a line level air gap, the first crack stop 128, through subsequent processing steps. Typically, the $M_{x+1}$ dielectric 124 may be planarized using, for example, conventional chemical mechanical techniques to ensure a clean and flat surface in preparation for subsequent processing.

The $M_{x+1}$ metal line 120 and the $M_{x+1}$ via 122 may be formed using damascene or dual damascene techniques well known in the art. A chemical mechanical polishing technique may be applied to ensure complete removal of excess conductive interconnect material prior to depositing the $M_{x+1}$ cap dielectric 126. The $M_{x+1}$ cap dielectric 126 may be substantially similar to the $M_x$ cap dielectric 114 described above with reference to FIG. 1.

Figure 4:
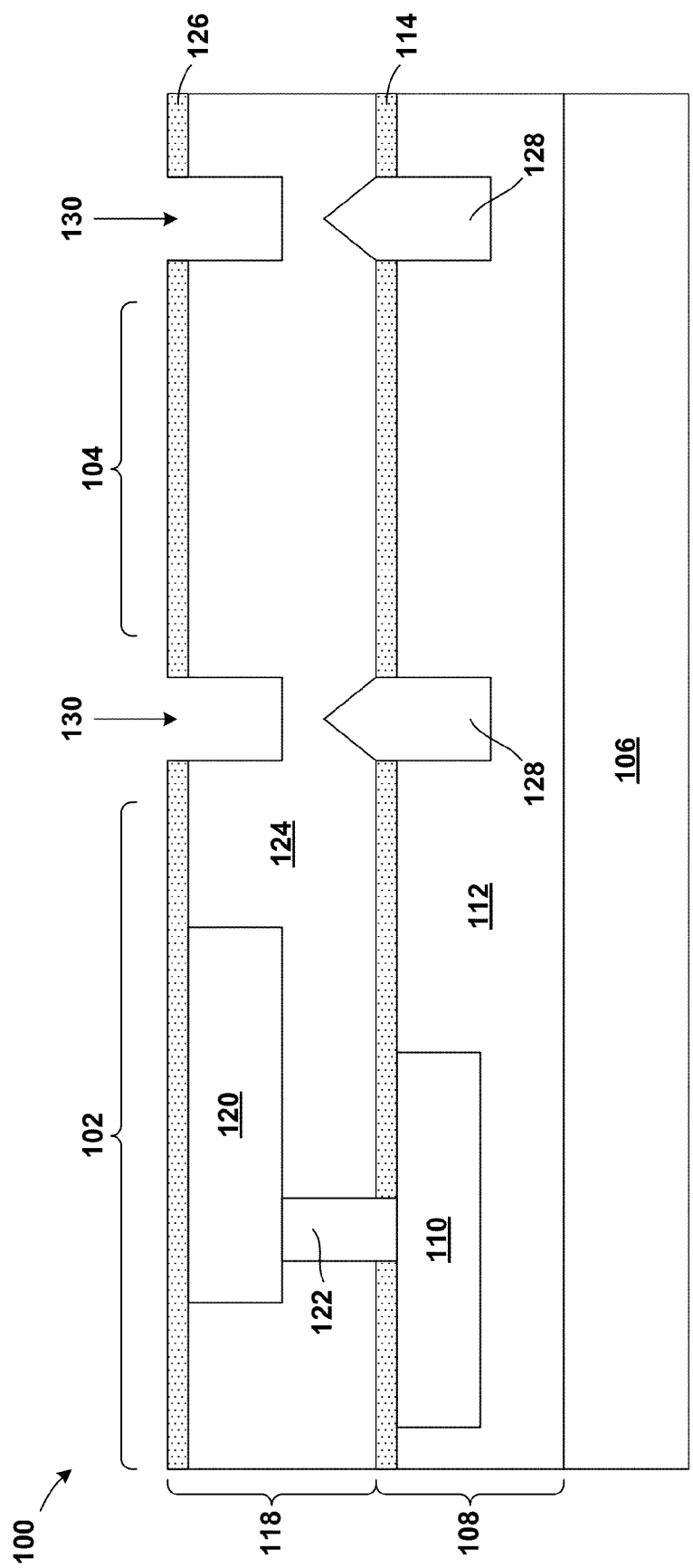

Referring now to FIG. 4, a second opening 130 may be formed through the $M_{x+1}$ cap dielectric 126 into the $M_{x+1}$ dielectric 124 of the $M_{x+1}$ level 118 using typical lithographic and etching techniques, as similarly described above with reference to the first opening 116. The second opening 130 is substantially similar, in all respects, to the first opening 116.

In an embodiment, the second opening 130 may also be purposefully positioned between the first region 102 and the second region 104. The second opening 130 may preferably extend a depth into the $M_{x+1}$ dielectric 124 without exposing an underlying level or intersecting in any way with an underlying line level air gap, such as for example, the first crack stop 128. Like the first opening 116, the second opening 130 may also have an aspect ratio of approximately 2:1 with a height approximately double its width. The second opening 130 may have a width similar to that of the first opening 116.

In fact, it is critical that line level air gaps fabricated in successive levels are vertically discontinuous and do not intersect or contact each other in order to maintain process uniformity and improved dimensional control of the size, specifically the width, of the line level air gaps. Such process uniformity and dimensional control allows the line level air gaps, and resulting crack stops, to be specifically tuned, with respect to size, for optimal stress relaxation to address a particular problem. If, for example, the second opening 130 were to intersect the first opening 116, further etching of the first opening 116 could not be controlled, resulting in poor process uniformity and poor dimensional stability.

Furthermore, like the first opening 116 (FIG. 2), the second opening 130 may preferably cross or intersect an interface between the $M_{x+1}$ dielectric 124 and the $M_{x+1}$ cap dielectric 126 where interfacial cracks and delamination may occur during fabrication. Locating the second opening 130 across the interface between the $M_{x+1}$ dielectric 124 and the $M_{x+1}$ cap dielectric 126 is essential to control the propagation of interfacial cracks along that interface. Furthermore, as illustrated in FIG. 4, the first crack stop 128 actually intersect the interfaces between the $M_x$ cap dielectric 114 and both the $M_x$ dielectric 112 and the $M_{x+1}$ dielectric 124. Similarly a second crack stop subsequently formed by the second opening 130 will intersect the interfaces between the $M_{x+1}$ cap dielectric 126 and both the $M_{x+1}$ dielectric 124 and a subsequently deposited dielectric material.

Figure 5:
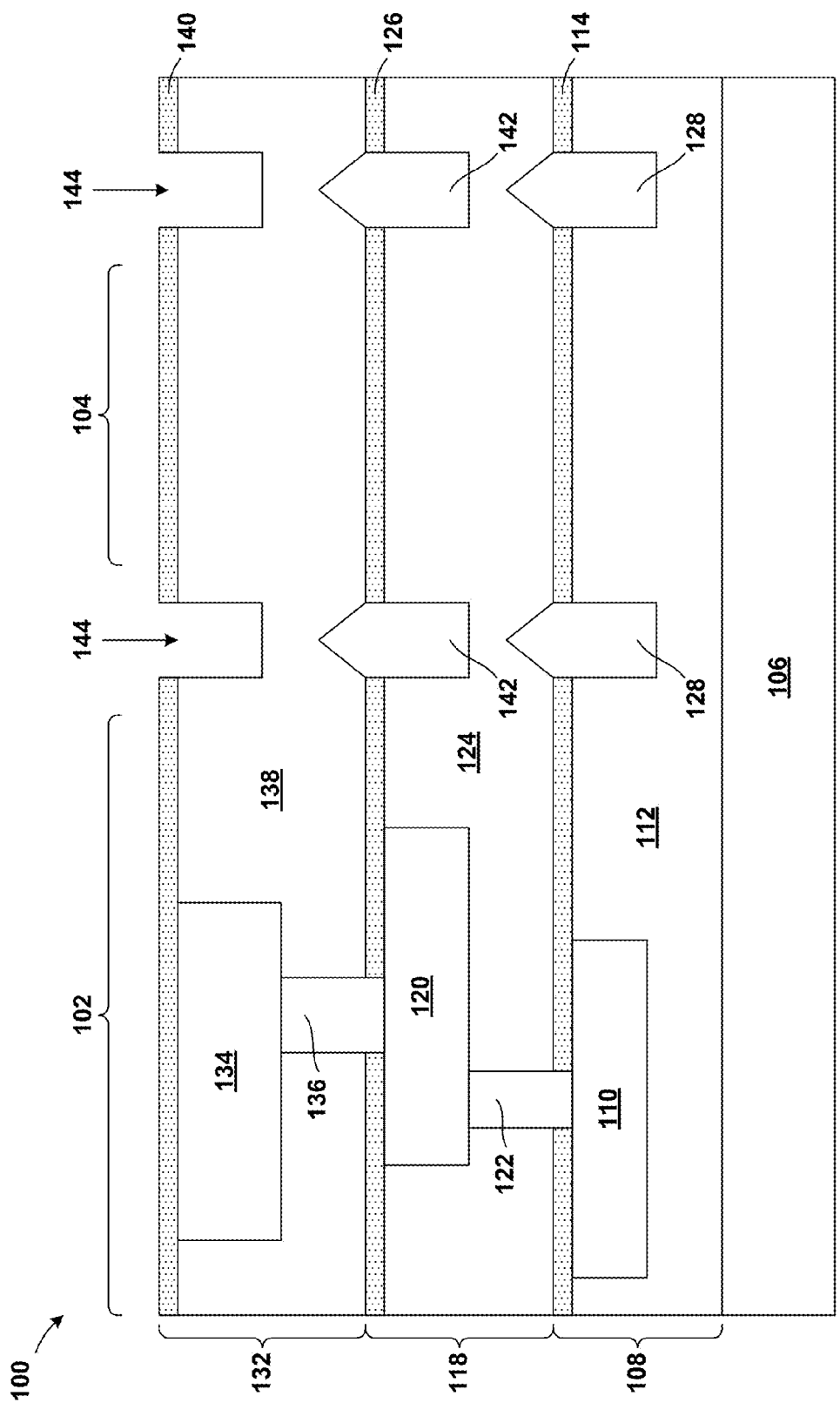

Referring now to FIG. 5, the above process steps may be repeated to form successive levels, each having a discrete crack stop feature separate and apart from all other crack stop features in the structure 100. For example, an $M_{x+2}$ level 132 may be formed above the $M_{x+1}$ level 118. The $M_{x+2}$ level 132 may include an $M_{x+2}$ metal line 134 and an $M_{x+2}$ via 136 both formed in an $M_{x+2}$ dielectric 138. The $M_{x+2}$ level 132 may further include an $M_{x+2}$ cap dielectric 140 directly above both the $M_{x+2}$ metal line 134 and the $M_{x+2}$ dielectric 138. The $M_{x+2}$ level 132 is substantially similar to either the $M_x$ level 108 or the $M_{x+1}$ level 118 described above. Moreover, similar techniques as described above may be used to deposit the $M_{x+2}$ dielectric 138 on top of the $M_{x+1}$ cap dielectric 126. Like above, a chemical mechanical polishing technique may be applied to ensure a clean and flat surface in preparation for forming the $M_{x+2}$ metal line 134 and the $M_{x+2}$ via 136 and subsequent processing.

After deposition of the $M_{x+2}$ dielectric 138, the second opening 130 (FIG. 4) may be pinched-off or capped to form another line level air gap or second crack stop 142. As illustrated in figures, the $M_{x+2}$ dielectric 138 pinches-off or blocks the second opening 130 (FIG. 4), thereby producing the second crack stop 142. By closing off the second opening 130 (FIG. 4), it is possible to maintain a line level air gap, the second crack stop 142, through subsequent processing steps. Typically, the $M_{x+2}$ dielectric 138 may be planarized using, for example, conventional chemical mechanical techniques to ensure a clean and flat surface in preparation for subsequent processing.

The $M_{x+2}$ metal line 134 and the $M_{x+2}$ via 136 may be formed using damascene or dual damascene techniques well known in the art. A chemical mechanical polishing technique may be applied to ensure complete removal of excess conductive interconnect material prior to depositing the $M_{x+2}$ cap dielectric 140. The $M_{x+2}$ cap dielectric 140 may be substantially similar to either the $M_x$ cap dielectric 114 or the $M_{x+1}$ cap dielectric 126 described above with reference to FIGS. 1 and 3.

Like above with reference to the first opening 116 and the second opening 130, a third opening 144 may be formed through the $M_{x+2}$ cap dielectric 140 into the $M_{x+2}$ dielectric 138 of the $M_{x+2}$ level 132 using typical lithographic and etching techniques. The third opening 144 is substantially similar, in all respects, to the first opening 116 and the second opening 130.

In an embodiment, the third opening 144 may also be purposefully positioned between the first region 102 and the second region 104. The third opening 144 may preferably extend a depth into the $M_{x+2}$ dielectric 138 without exposing an underlying level or intersecting in any way with an underlying line level air gap, such as for example, the second crack stop 142. Like the first and second openings 116, 130, the third opening 144 may also have an aspect ratio of approximately 2:1 with a height approximately double its width. The third opening 144 may have a width similar to that of the first and second openings 116, 130.

In fact, it is critical that line level air gaps fabricated in successive levels are vertically discontinuous and do not intersect or contact each other in order to maintain process uniformity and improved dimensional control of the size, specifically the width, of the line level air gaps. Such process uniformity and dimensional control allows the line level air gaps, and resulting crack stops, to be specifically tuned, with respect to size, for optimal stress relaxation to address a particular problem. If, for example, the third opening 144 were to intersect the second opening 130, further etching of the second opening 130 could not be controlled, resulting in poor process uniformity and poor dimensional stability.

Furthermore, like the first opening 116 (FIG. 2) and the second opening 130 (FIG. 4), the third opening 144 may preferably cross or intersect an interface between the $M_{x+2}$ dielectric 138 and the $M_{x+2}$ cap dielectric 140 where interfacial cracks and delamination may occur during fabrication. Locating the third opening 144 across the interface between the $M_{x+2}$ dielectric 138 and the $M_{x+2}$ cap dielectric 140 is essential to control the propagation of interfacial cracks along that interface. Furthermore, as illustrated in FIG. 5, the second crack stop 142 actually intersects the interfaces between the $M_{x+1}$ cap dielectric 126 and both the $M_{x+1}$ dielectric 124 and the $M_{x+2}$ dielectric 138. Similarly a third crack stop (not shown) subsequently formed by the third opening 144 will intersect the interfaces between the $M_{x+2}$ cap dielectric 140 and both the $M_{x+2}$ dielectric 138 and a subsequently deposited dielectric material.

Figure 6:
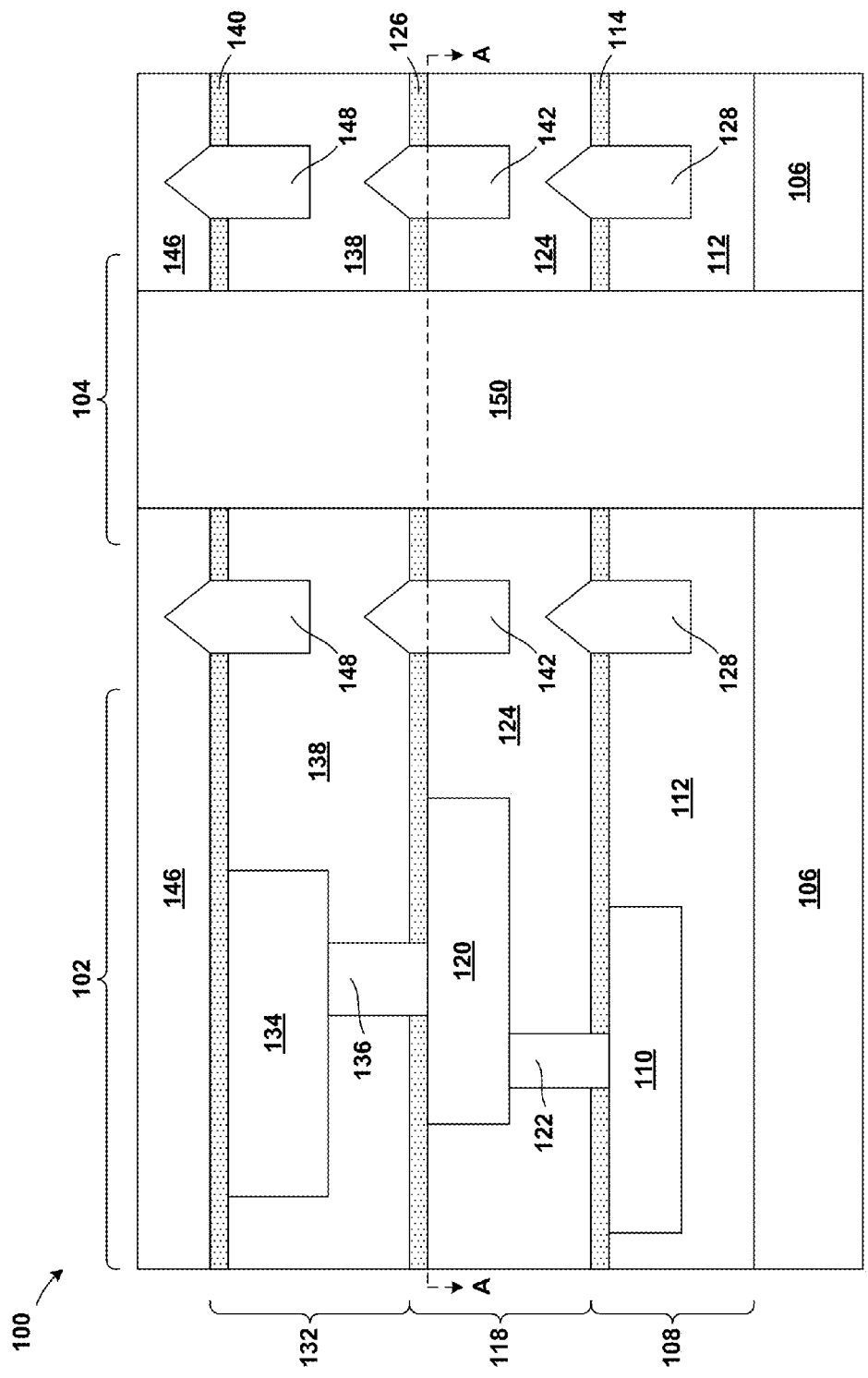

Referring now to FIG. 6, a final dielectric layer 146 may be formed directly on top of the $M_{x+2}$ cap dielectric 140. The final dielectric layer 146 may be substantially similar in all respects to any of the dielectric layers of the $M_x$ level, the $M_{x+1}$ level, or the $M_{x+2}$ level. After deposition of the final dielectric layer 146, the third opening 144 may be pinched-off or capped to form a line level air gap or third crack stop 148. As illustrated in figures, the final dielectric layer 146 pinches-off or blocks the third opening 144, thereby producing the third crack stop 148. By closing off the third opening 144, it is possible to maintain a line level air gap, the third crack stop 148, through subsequent processing steps. Typically, the final dielectric layer 146 may be planarized using, for example, conventional chemical mechanical techniques to ensure a clean and flat surface in preparation for subsequent processing.

As previously stated the above process steps may be repeated to form successive levels, each having a discrete crack stop feature separate and apart from all other crack stop features in the structure 100. More specifically, the above process steps may be repeated similarly in one level, multiple levels, or all levels of the structure 100. In general, line level air gaps, and as such resulting crack stop features, may preferably be formed at all levels in order to best protect against the propagation of delamination and cracking due to the subsequent formation of the through substrate via.

Finally, a through substrate via 150 may be fabricated in the second region 104. The through substrate via 150 may be fabricated using masking and etching techniques well known in the art. As is typical, the through substrate via 150 may extend through an entire thickness of the structure 100 and may be used to make electrical connections from one side of the structure 100 to the opposite side of the structure 100. The through substrate via 150 may be cylindrical or annular.

It should be noted that while only a limited number of wiring levels and a single through substrate via are illustrated and described as part of this description, the structure 100 may include any number of wiring levels and any number of through substrate vias surrounded by any configuration of line level air gaps according to present description.

In general, the line level air gaps or the crack stops 128, 142, 148 may be deliberately positioned between the first region 102 and the second region 104 to prevent the propagation of cracks stemming from the second region 104 caused during the fabrication of the through substrate via 150. Practically, the crack stops 128, 142, 148 may be positioned as close to the through substrate via 150 as possible to conserve space; however, the exact proximity is not critical. Furthermore, the line level air gaps or the crack stops 128, 142, 148 may have a width approximately equal to or greater than 10 nm in order to provide adequate stress relaxation and prevent the propagation of crack caused by the formation of the through substrate via 150.

The vertical discontinuity of crack stops (128, 142, 148) fabricated in successive interconnect levels provide unique advantages over known structures and fabrication techniques. First, because each successive crack stop is fabricated separate and apart from the previous, improved control over the width of each crack stop may be achieved. As such, fabricating successive crack stops having substantially similar or uniform widths is made possible. Unlike conventional techniques which rely on a RIE process to fabricate a single continuous crack stop through multiple interconnect levels. However, in current RIE processes, the size of the crack stop design tends to be fairly wide, on the order of approximately 10 µm. This is mainly due to the fact that RIE cannot effectively etch through several layers of dielectric, etc. without also increasing the width of the resultant trench. Without increasing the width of the trench, for example, the conventional RIE process cannot etch through all of the levels of the interconnected circuit, in particular the lower levels, and hence cannot effectively stop the propagation of the crack.

Second, the crack stops of the embodiments disclosed herein are individually tunable. More specifically, the size or width, or positioning of each crack stop in each successive interconnect level may be specifically tuned independent from other crack stops fabricated in adjacent interconnect levels. For example, the width of each crack stop may correspond to the interconnect level in which it is formed. Conventional techniques do not allow for the fabrication of multiple individual a crack stops each having a width that is different from other crack stops in adjacent interconnect levels. Conversely, various widths of the single continuous crack stop fabricated according to known technique cannot independently correspond and have no independent correlation with any characteristic of the interconnect level.

Figure 7:
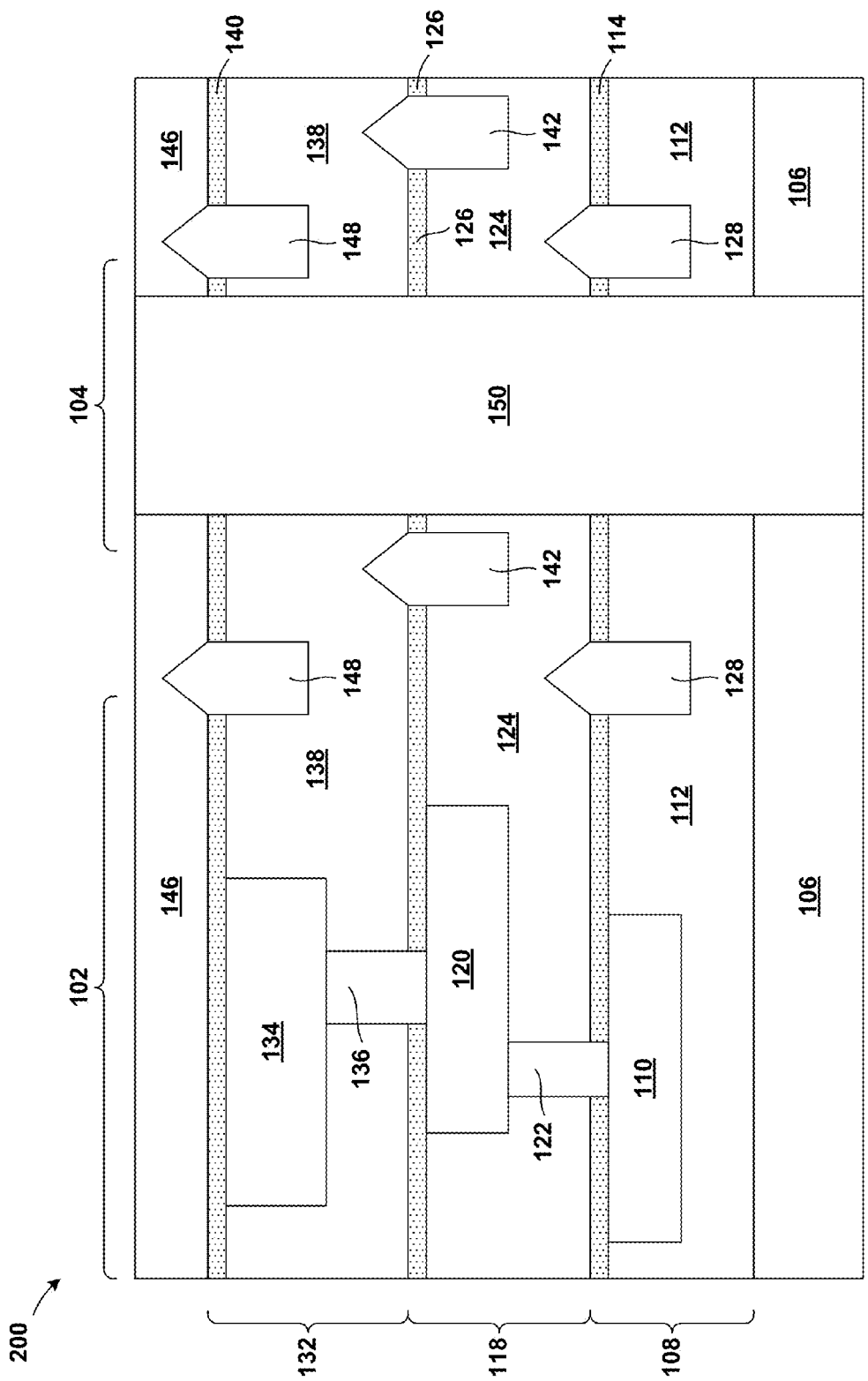
FIG. 7 illustrates the final structure of FIG. 7 according to an alternative embodiment.

Referring now to FIG. 7, a structure 200 is illustrated according to an alternative embodiment. The structure 200 is substantially similar in all respects to the structure 100 of FIG. 6 except as noted below. In the present embodiment, the crack stops 128, 142, 148 may be offset from one another. More specifically, for example, the crack stop 128 of the $M_x$ level 108 may be offset from the crack stop 142 of the $M_{x+1}$ level 118. Like above, the crack stops 128, 142, 148 of the structure 200 are vertically discontinuous and do not intersect or contact each other in order to maintain process uniformity and improved dimensional control of the size, specifically the width, of the line level air gaps. By offsetting the crack stops 128, 142, 148 of successive interconnect levels is one example of how to ensure the crack stops 128, 142, 148 do not intersect or contact each other.

Figure 8:
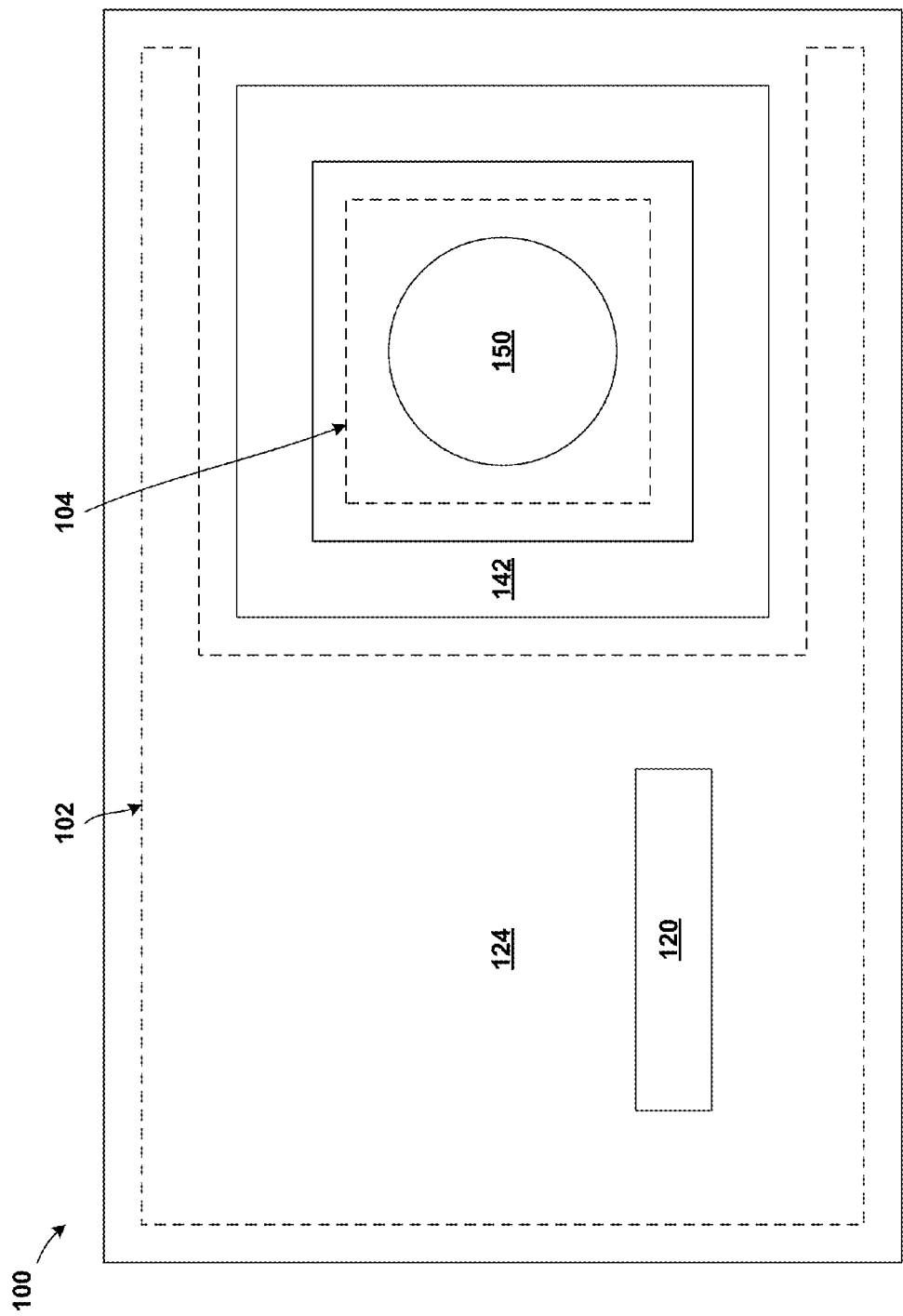
FIG. 8 illustrates a cross-section view of FIG. 6 along section line A-A, according to an exemplary embodiment.
Figure 9:
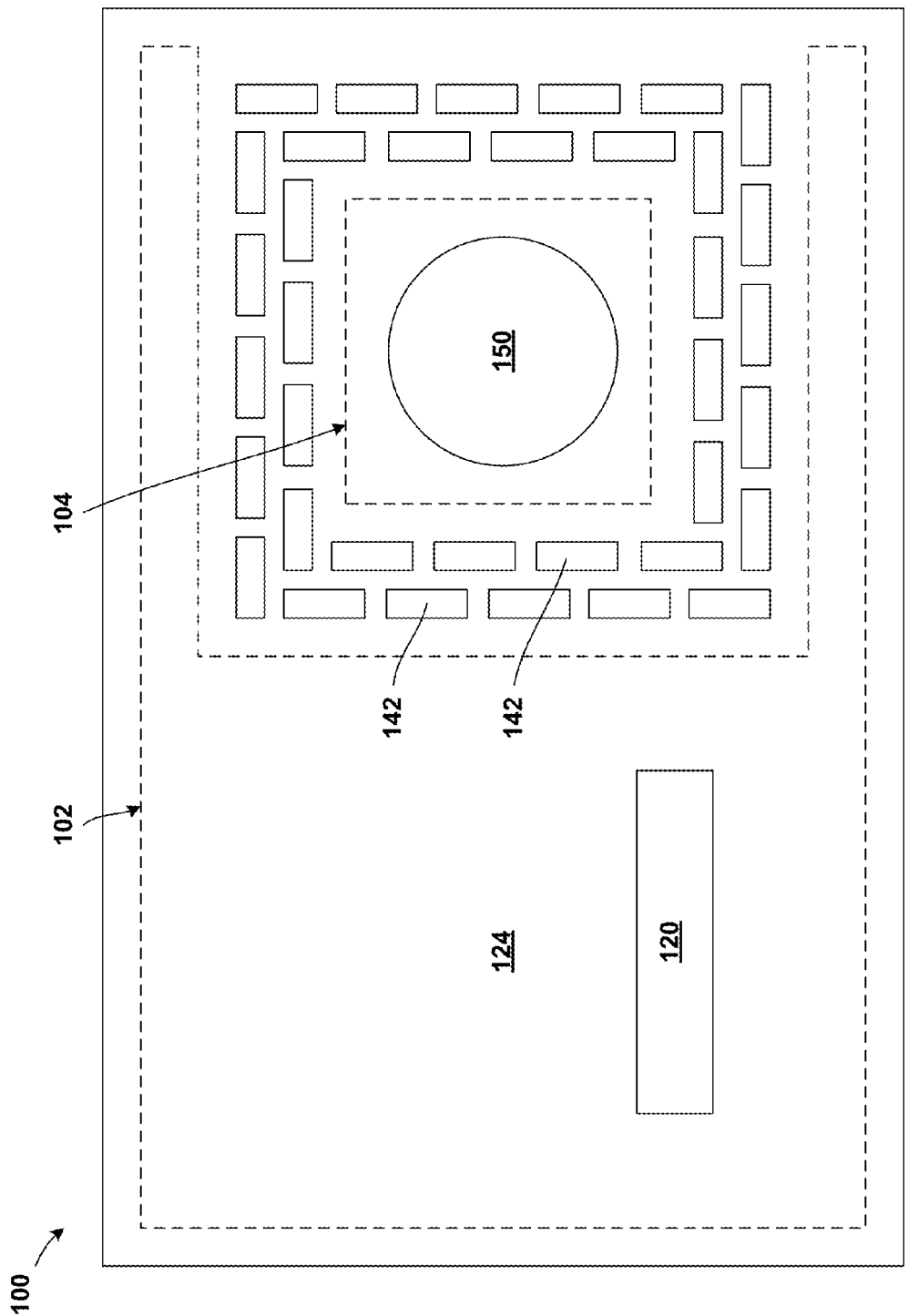
FIG. 9 illustrates a cross-section view of FIG. 6 along section line A-A, according to an exemplary embodiment.

Referring now to FIGS. 8 and 9, a cross-sectional view, along section line A-A, of the structure 100 in FIG. 6 is shown. It should be noted that while the cross section view is taken along the intersection between the $M_{x+1}$ dielectric 124 and the $M_{x+1}$ cap dielectric 126, it is illustrated and described as an exemplary cross section intended to illustrate the relationship between the crack stop 142 and the though substrate via 150, and is not intended to be limiting. Rather, a cross section view of the structure 100 taken at any other level may illustrate a similar relationship between any of the crack stops 128, 142, 148 and the through substrate via 150.

With specific reference to FIG. 8, a particular crack stop configuration in relation to the through substrate via 150 according to an exemplary embodiment is shown. In the present example, the crack stop 142 may completely surround the through substrate via 150 with a continuous air gap. The crack stop 142 in the present example may be referred to as being circumferentially continuous.

With specific reference to FIG. 9, another crack stop configuration in relation to the through substrate via 150 according to an exemplary embodiment is shown. In the present example, the crack stop 142 may not completely surround the through substrate via 150 with a continuous air gap. In other words, the crack stop 142 is not a continuous feature that surrounds the through substrate via 150. Instead, the crack stop 142 may be described as a discontinuous feature including multiple smaller air gaps positioned adjacent to one another and separated by a space. The series of smaller air gaps may be positioned in various configurations that which completely surround the through substrate via 150. It should be noted that no single air gap completely surrounds the through substrate via 150; however, the series of multiple smaller air gaps do completely surround the though substrate via 150.

In an embodiment, the crack stop 142 may include a single row of smaller air gaps surrounding the through substrate via 150; however, the space between individual smaller air gaps may allow for delamination and cracks to propagate from the second region 104 and infect the first region 102 which is an undesirable outcome. As such, multiple rows of smaller air gaps may be configured to surround the through substrate via 150, as illustrated in FIG. 9. It should be noted that in multiple row configurations, as shown, the smaller air gaps of each row may be intentionally offset from one another in order to protect or block a space between adjacent air gaps of the adjacent row. In other words, a single air gap may be aligned or position specifically to overlap a space between adjacent air gaps of the adjacent row, as illustrated. The requisite offset between multiple rows is preferred to effectively prevent the propagation of delamination and cracks. The crack stop 142 in the present example may be referred to as being circumferentially discontinuous. Finally, it should be noted that multiple smaller air gaps may be arranged in any configuration that which will prevent delamination and cracks from propagating and infecting the first region 102 during fabrication of the through substrate via 150.

It should be noted that the above description of embodiments relate generally to the fabrication of a vertically discontinuous air gap crack stop. More specifically, the crack stops 128, 142, and 148 may cumulatively be referred to as the vertically discontinuous air gap crack stop. The vertically discontinuous air gap crack stop may include multiple individual line level air gaps or crack stops (128, 142, 148).

Another way to manufacture the vertically discontinuous air gap crack stop may include depositing an additional dielectric layer within each partial depth air gap staked above one another in multiple successive metallization layers. One embodiment by which to fabricate the discontinuous air gap crack stop with the additional dielectric layer is described in detail below by referring to the accompanying drawings FIGS. 10 and 11. The following description is intended to be cumulative and in addition to the description above with reference to FIGS. 1-6, and will focus on the details related to the additional dielectric layer.

Figure 10:
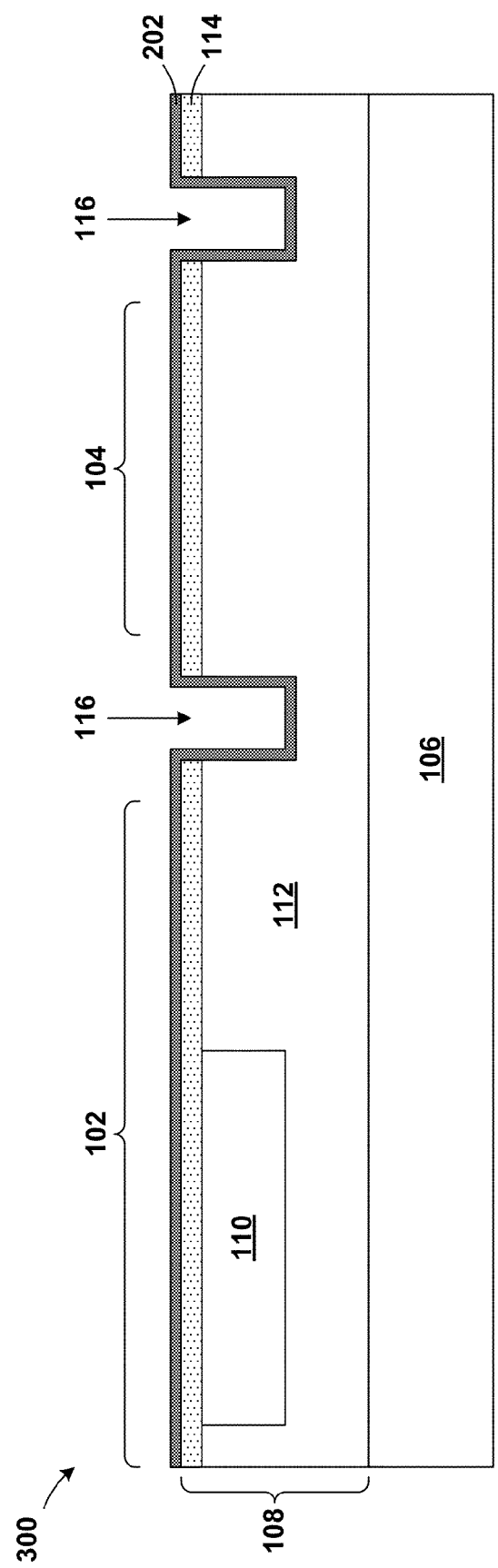
FIG. 10 illustrates forming a dielectric layer above and within the first opening of the $M_x$ level, according to an alternative exemplary embodiment.

Referring now to FIG. 10, a structure 300 according to another embodiment, is shown. For example, after formation of the $M_x$ metal line 110 and the first opening 116 in the $M_x$ level 108 in FIG. 1, a dielectric layer 202 may be conformally deposited directly on top of the structure 100 and within the first opening 116. The dielectric layer 202 may include the same materials as the $M_x$ cap dielectric 114 described above. The dielectric layer 202 may have a typical thickness such as not to pinch-off or fill the first opening 116 to ensure the subsequent formation of a line level air gap as described above. In an embodiment, the dielectric layer may include silicon carbon nitride (SiCN) deposited using a chemical vapor deposition technique with a conformal thickness ranging from about 3 nm to about 15 nm and ranges there between, although a thickness less than 3 nm and greater than 15 nm may be acceptable.

Most notably, the dielectric layer 202 may be deposited to further prevent delamination and cracks from propagating from the second region 104 into the first region 102. More specifically, because cracks are most likely to develop and propagate along the interface between the $M_x$ dielectric 112 and the $M_x$ cap dielectric 114, the dielectric layer 202 provides a perpendicular interface designed to further prevent cracks from propagating from the second region 104 into the first region 102. Specifically, the interface between the dielectric layer 202 and the $M_x$ dielectric 112 is perpendicular to the interface between the $M_x$ dielectric 112 and the $M_x$ cap dielectric 114.

Figure 11:
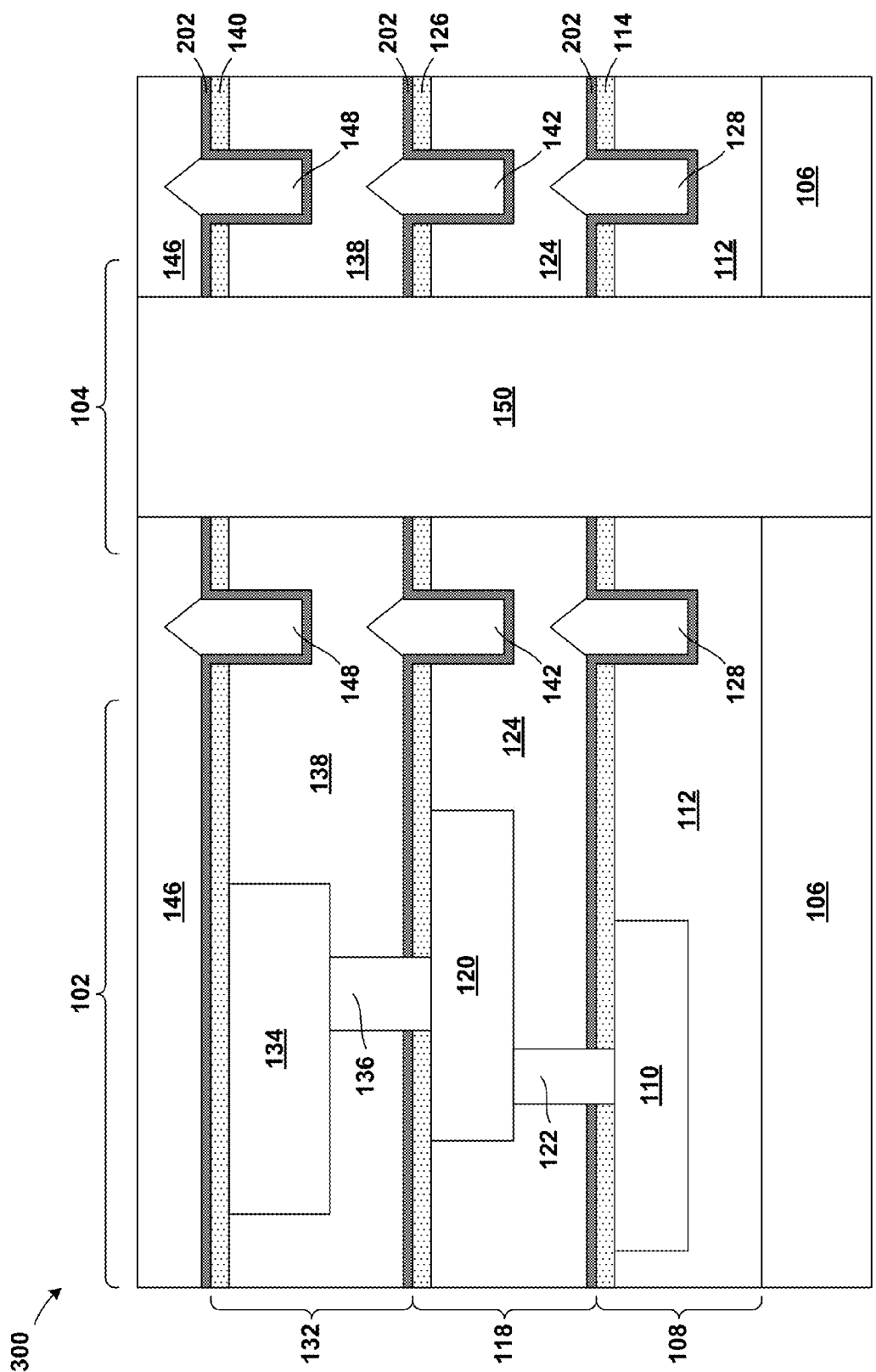
FIG. 11 illustrates a final structure according to the alternative exemplary embodiment.

Referring now to FIG. 11, the structure 300 is shown after the formation of The $M_{x+1}$ level 118 and the $M_{x+2}$ level 132 according to the present embodiment. As illustrated, the dielectric layer 202 may be deposited at any level immediately prior to the subsequent level is added thereabove.

Figure 12:
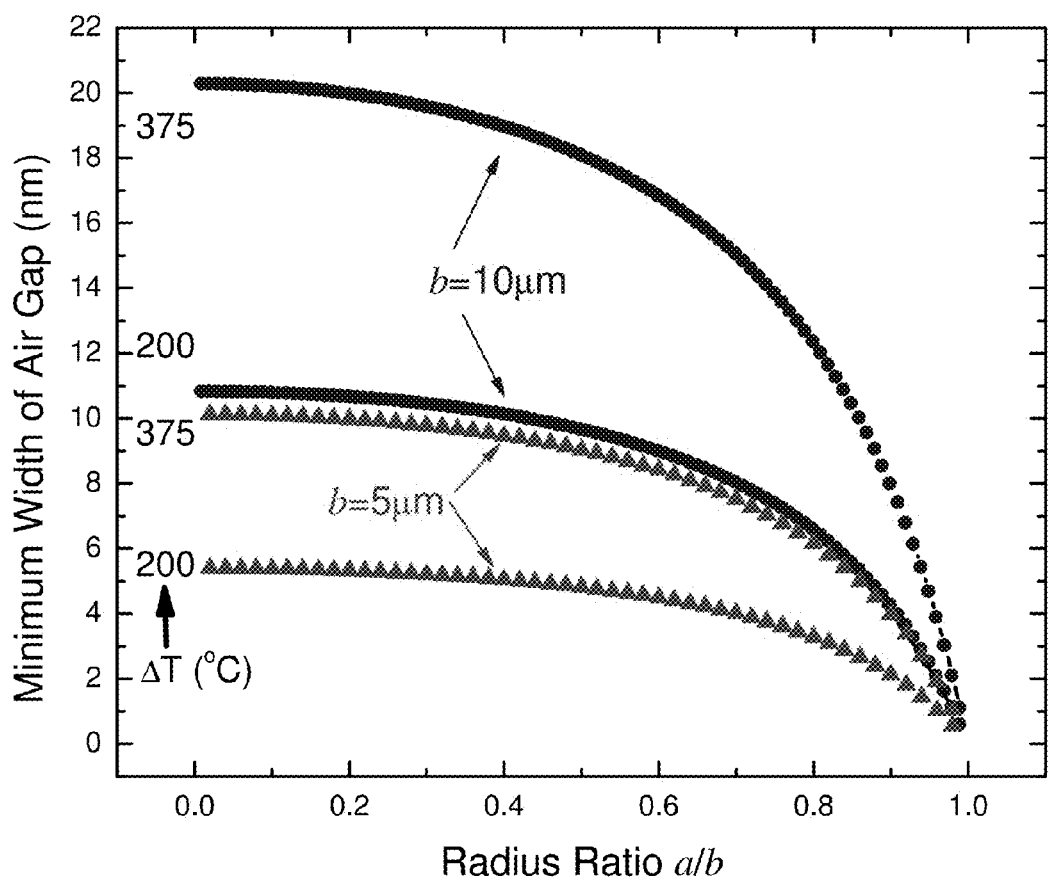
FIG. 12 illustrate a graph illustrating a relationship between a width of a line level air gap and a size or diameter of a through-substrate via.

Referring now to FIG. 12, a graphical model illustrating a relationship between a width of the crack stop (128, 142, 148) and their effectiveness of preventing the propagation of cracks during fabrication of the through substrate via 150 is shown. The model indicates that for various through-substrate via configurations, crack stops having a width equal to or greater than about 10 nm may prove to be more functional and more effective at preventing cracks from propagation from a through-substrate via during fabrication. The model uses a fundamental solution of an axisymmetric elastic body problem:

$$\sigma_r = \frac{A}{r^2} + B$$

$$\sigma_\theta = -\frac{A}{r^2} + B$$

$$u = -\frac{1+v}{E}\frac{A}{r} + \frac{1-v}{E}Br \text{ (plane stress)}$$

Figure 13:
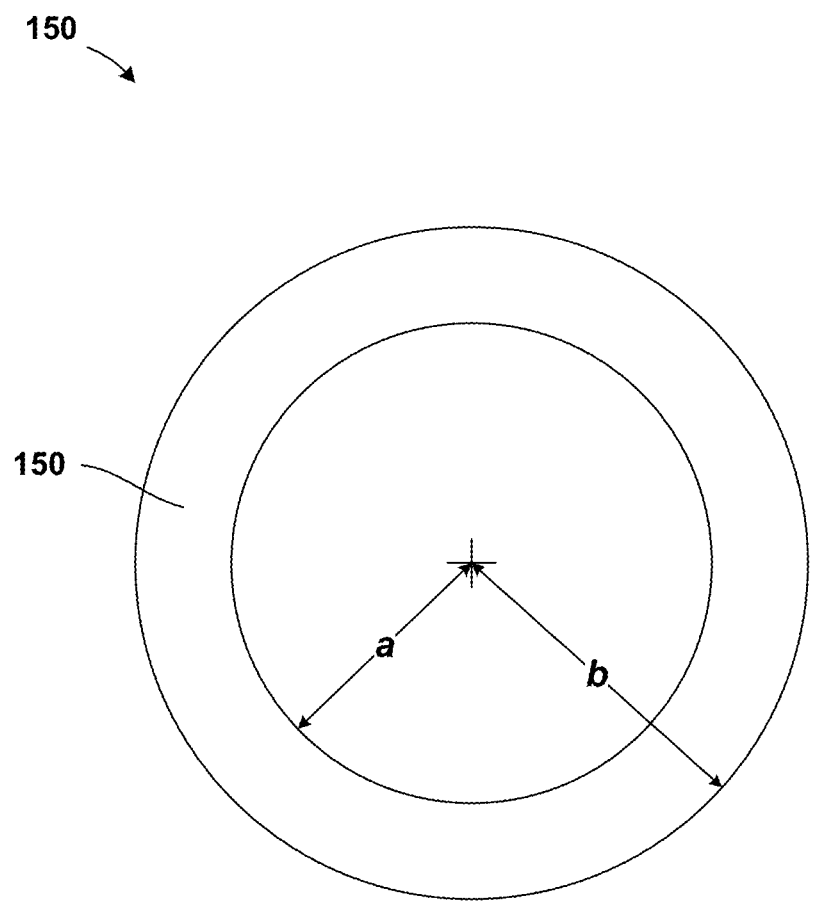
FIG. 13 illustrates a cross section view of a through substrate via according to an exemplary embodiment.

Minimum width of an air gap may be determined by requiring the interfacial stress at the circumference or outer edge of the through-substrate via too be zero; from which the following equation may be derived:

$$\delta_{min} = b\Delta T\left(\alpha - \alpha_m + 2\frac{\alpha_i - \alpha}{[1 + v + (1 - v_i)E/E_i](b/a)^2 + 1 - v - (1 - v_i)E/E_i}\right)$$

where $E$ is the elastic modulus, $v$ is Poisson ratio, $\alpha$ is coefficient of thermal expansion, and a and b are the inner radius and outer radius, respectively, of an annulus through substrate via. See FIG. 13. Additionally, subscripts i and m are for the material inside and outside the annulus TSV, respectively.

For cylindrical through substrate vias in which a equals zero, the equation is:

$$\delta_{min} = b\Delta T(\alpha - \alpha_m)$$

Based on the analysis the width of an air gap around the through-substrate via may have sub-micron dimensions, and more preferably tens to hundreds of nanometers. In general, the model suggests that a wider air gap is required to relieve the stress from cylindrical through-substrate via as compared the air gap used for an annular through-substrate via. Conversely, a narrower air gap is required to relieve the stress from an annular through substrate via as compared the air gap used for a cylindrical through-substrate via. In addition, a larger through substrate via may necessitate a wider gap to adequately relieve the stress from the through substrate via.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
a first interconnect level comprising a first metal interconnect embedded in a first dielectric layer and a first dielectric capping layer directly on top of the first dielectric layer and directly on top of the first metal interconnect;
a first crack stop partially embedded in the first interconnect level, the first crack stop is an air gap which intersects an interface between the first dielectric layer and the first dielectric capping layer and partially extends into the first dielectric layer, a height or depth of the first crack stop is less than a height or thickness of the first interconnect level; and
a through substrate via extending through the first interconnect level adjacent to, but not in physical contact with, the first crack stop, the first crack stop is positioned directly between the first metal interconnect and the through substrate via to prevent cracks caused during fabrication from propagating away from the through substrate via and damaging the first metal interconnect, wherein the first crack stop completely surrounds the through substrate via with a continuous air gap.

2. The structure of claim 1, further comprising:
a second interconnect level above the first interconnect level comprising a second metal interconnect embedded in a second dielectric layer and a second dielectric capping layer directly on top of the second dielectric layer and directly on top of the second metal interconnect; and
a second crack stop partially embedded in the second interconnect level, the second crack stop is an air gap which intersects an interface between the second dielectric layer and the second dielectric capping layer and partially extends into the second dielectric layer, wherein the through substrate via also extends through the second interconnect level.

3. The structure of claim 1, wherein a width of the first crack stop is equal to or greater than 10 nm to ensure adequate protection against the propagation of cracks stemming from the fabrication of the through substrate via.

4. The structure of claim 1, wherein the first crack stop is vertically aligned with one or more crack stops of adjacent interconnect levels, and the first crack stop does not physically contact any other crack stop in any adjacent interconnect level.

5. A structure comprising:
a dielectric layer;
a dielectric capping layer positioned on the dielectric layer, wherein a portion of the dielectric capping layer contacts and overlies the dielectric layer; and
a crack stop region positioned partially within the dielectric layer and the dielectric capping layer and intersecting an interface between the dielectric layer and the dielectric capping layer, such that the crack stop region laterally abuts and is surrounded by the dielectric layer and the dielectric capping layer, wherein a height of the crack stop region is less than a combined height of the dielectric layer and the dielectric capping layer, and wherein the crack stop region defines a continuous air gap completely surrounding a through substrate via positioned within the dielectric layer and the dielectric capping layer.

6. The structure of claim 5, wherein a width of the crack stop region is at least 10 nanometers (nm).

7. The structure of claim 5, wherein the crack stop region is vertically aligned with one or more crack stop regions of a vertically adjacent interconnect level.

8. The structure of claim 5, wherein the crack stop region is discontinuous with the one of more crack stop regions of the vertically adjacent interconnect level.

9. The structure of claim 5, wherein the crack stop region is positioned laterally between the through substrate via and a metal interconnect positioned within the dielectric layer.

10. The structure of claim 9, wherein the dielectric layer laterally separates the crack stop region from the metal interconnect and the through substrate via.

11. A structure comprising:
a interconnect level having a dielectric layer and a capping dielectric layer positioned thereon, wherein the interconnect level includes a first portion having a conductive material therein; and
a crack stop region having a first sidewall positioned laterally adjacent to the first portion of the interconnect level and having a height less than the interconnect level, wherein the crack stop region intersects an interface between the dielectric layer and the capping dielectric layer in the interconnect level, and wherein the crack stop region defines a continuous air gap completely surrounding the first portion of the interconnect level, such that the interconnect level includes a second portion directly laterally adjacent to a second sidewall of the crack stop region.

12. The structure of claim 11, wherein a lateral width between the first and second sidewalls of the crack stop region is at least 10 nanometers (nm).

13. The structure of claim 11, wherein the crack stop region is vertically aligned with a crack stop region of a vertically adjacent interconnect level.

14. The structure of claim 11, wherein the crack stop region is discontinuous with the crack stop region of the vertically adjacent interconnect level.

15. The structure of claim 11, wherein the conductive material comprises a through substrate via.

16. The structure of claim 15, further comprising a metal interconnect positioned within the second portion of the interconnect level, such that the crack stop region is positioned laterally between the through substrate via and the crack stop region.

17. The structure of claim 11, wherein the crack stop region intersects a portion of a vertically adjacent interconnect level positioned over the interconnect level.

18. The structure of claim 11, wherein the crack stop region is non-aligned with a crack stop region of a vertically adjacent interconnect level.

* * * * *